(12) United States Patent
Chen

(10) Patent No.: US 9,748,123 B2
(45) Date of Patent: Aug. 29, 2017

(54) PRESSURE-CONTROLLED WAFER CARRIER AND WAFER TRANSPORT SYSTEM

(71) Applicant: Taiwan Semiconductor Manufacturing Company, Ltd., Hsin-Chu (TW)

(72) Inventor: Shih-Hung Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 519 days.

(21) Appl. No.: 13/831,498

(22) Filed: Mar. 14, 2013

(65) Prior Publication Data

US 2014/0271053 A1    Sep. 18, 2014

(51) Int. Cl.
*H01L 21/67*    (2006.01)
*H01L 21/687*   (2006.01)

(52) U.S. Cl.
CPC .. *H01L 21/67126* (2013.01); *H01L 21/67201* (2013.01); *H01L 21/68735* (2013.01)

(58) Field of Classification Search
USPC ........................................................ 414/217
See application file for complete search history.

(56) References Cited

U.S. PATENT DOCUMENTS

| | | | |
|---|---|---|---|
| 5,398,481 A | | 3/1995 | Takeuchi et al. |
| 5,678,116 A | * | 10/1997 | Sugimoto ............. G03F 7/3021 396/611 |
| 6,065,481 A | * | 5/2000 | Fayfield ............ H01L 21/02049 134/1.3 |
| 6,123,120 A | * | 9/2000 | Yotsumoto ........ H01L 21/67389 141/59 |
| 6,274,490 B1 | * | 8/2001 | Chyan ............... H01L 21/28176 257/565 |

(Continued)

FOREIGN PATENT DOCUMENTS

JP    Hei06-198160    7/1994

OTHER PUBLICATIONS

Office Action issued on Mar. 17, 2015 in Korean Application No. 10-2013-0158426, filed Dec. 18, 2013.

*Primary Examiner* — Michael McCullough
*Assistant Examiner* — Ashley Romano
(74) *Attorney, Agent, or Firm* — Haynes and Boone, LLP

(57) ABSTRACT

Disclosed are a wafer carrier that keeps wafers under a constant pressure, at any preset value below or above the atmospheric pressure, to prevent wafer contaminations arising from atmospheric exposure in conventional wafer carriers, and also, a wafer transport system and method utilizing the same wafer carrier. The wafer carrier charged with a preset carrier pressure is transported and docked with an airlock of a wafer processing tool comprising the airlock, a vacuum transfer module, and a process chamber. The airlock adjusts, by a gas pump, inner pressure to equate successively with, first, the carrier pressure before opening the carrier door, and next, the vacuum transfer module pressure before opening the latter's door. The wafers are then transferred into the process chamber. After processing, the wafers are transferred back into the wafer carrier and charged with the preset carrier pressure before undocked and transported to the next wafer processing tool.

20 Claims, 7 Drawing Sheets

(56) References Cited

U.S. PATENT DOCUMENTS

| | | | |
|---|---|---|---|
| 2003/0209097 A1* | 11/2003 | Hunter | G03F 7/707 73/865.9 |
| 2008/0232948 A1* | 9/2008 | van der Meulen | B65G 25/02 414/805 |
| 2009/0129897 A1 | 5/2009 | Babbs et al. | |

* cited by examiner

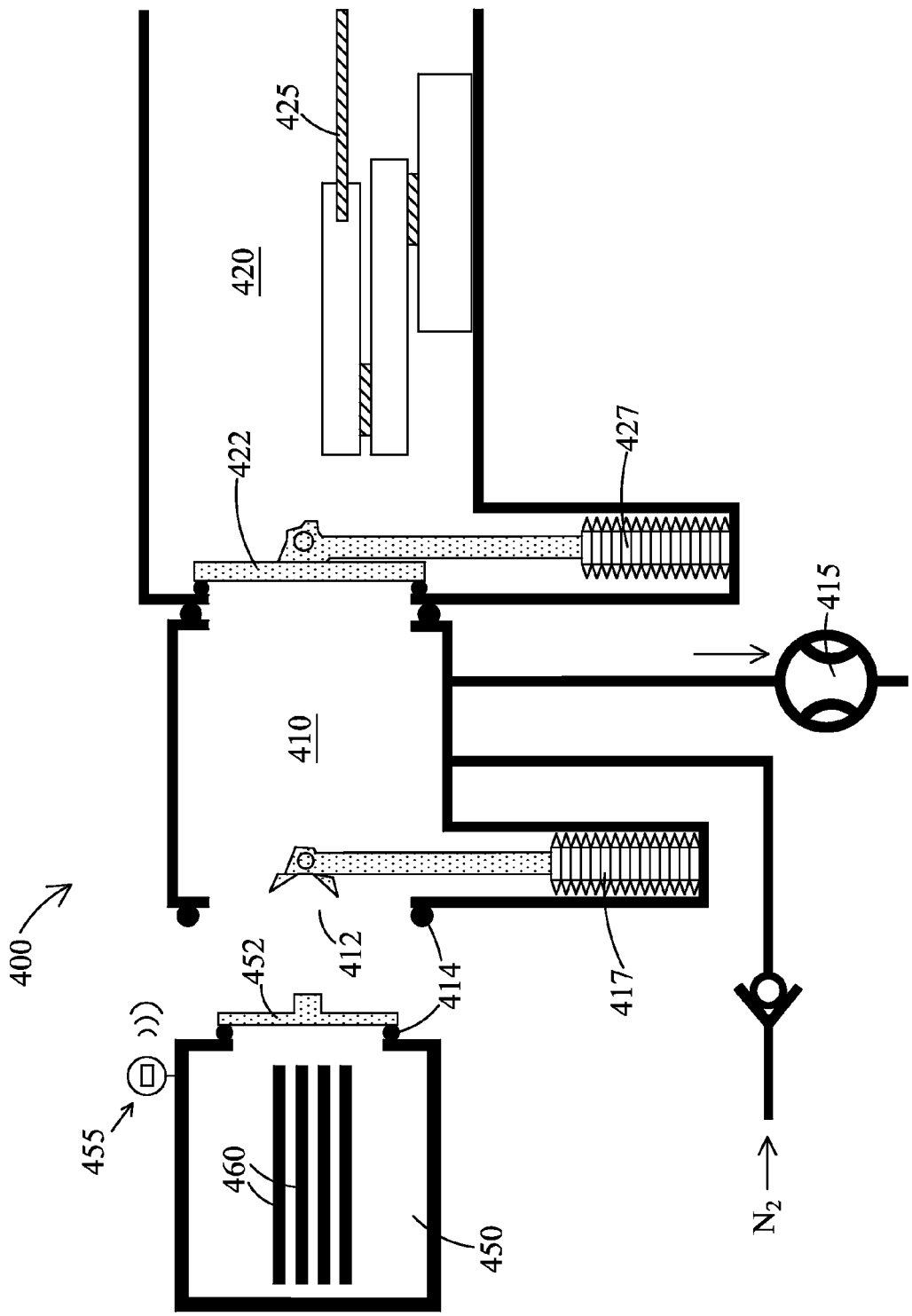

PRESSURE-CONTROLLED WAFER CARRIER AND WAFER TRANSPORT SYSTEM

BACKGROUND

The semiconductor integrated circuit (IC) industry has experienced exponential growth. Technological advances in IC materials, and processing operations have produced generations of ICs where each generation has smaller and more complex circuits than the previous generation.

ICs are formed on wafers, which must go through hundreds of processing steps, each of which is typically performed in a process chamber of a wafer processing tooling specially designed for the particular process, in many cases, under a vacuum or near-vacuum condition. Typically, the wafers are automatically transported from one wafer processing tooling to another by a wafer transfer system called an automatic material handling system (AMHS), while being contained in a wafer carrier called a front opening unified pod or a front opening universal pod (FOUP). A FOUP is a specialized plastic enclosure designed to hold silicon wafers securely and safely, and to allow the wafers to be removed for processing or measurement into a wafer processing tool equipped with appropriate load ports and robotic handling systems. A typical FOUP contains about 25 wafers of 300 mm diameter that are held securely by fins in the FOUP, and has a front opening door to allow robot handling mechanisms to access the wafers.

The sealing system of the currently used FOUPs is not adapted to provide and maintain any vacuum or pressurized environment to the wafers, and so, the wafers are kept in the FOUPs under an atmospheric pressure. This may result in problems such as allowing moisture and/or chemicals to enter into the FOUPS, which may contaminate the wafers.

To prevent such a potential wafer contamination, therefore, it is desirable to provide a wafer carrier, which can provide a constant preset pressure to the wafers therein during transportation, a pressure either lower or higher than the atmospheric pressure depending on a particular need. And it is further desirable to provide an improved system and method of transferring wafers that can, by utilizing such a pressure-controlled wafer carrier, not only eliminate the wafer contamination problem, but also reduce the wafer transfer time, the time spent for a wafer carrier to move between two neighboring wafer processing tools.

BRIEF DESCRIPTION OF THE DRAWINGS

The present disclosure is best understood from the following detailed description when read with accompanying figures. It is emphasized that, in accordance with the standard practice in the industry, various features in the drawings are not drawn to scale and are used for illustration purpose only. In fact, the dimension of the various features may be arbitrarily increased or reduced for clarity of discussion.

FIGS. 4A-4D schematically show selected steps of the method illustrated in FIG. 3 according an aspect of the present disclosure.

DETAILED DESCRIPTION

Figure 1:
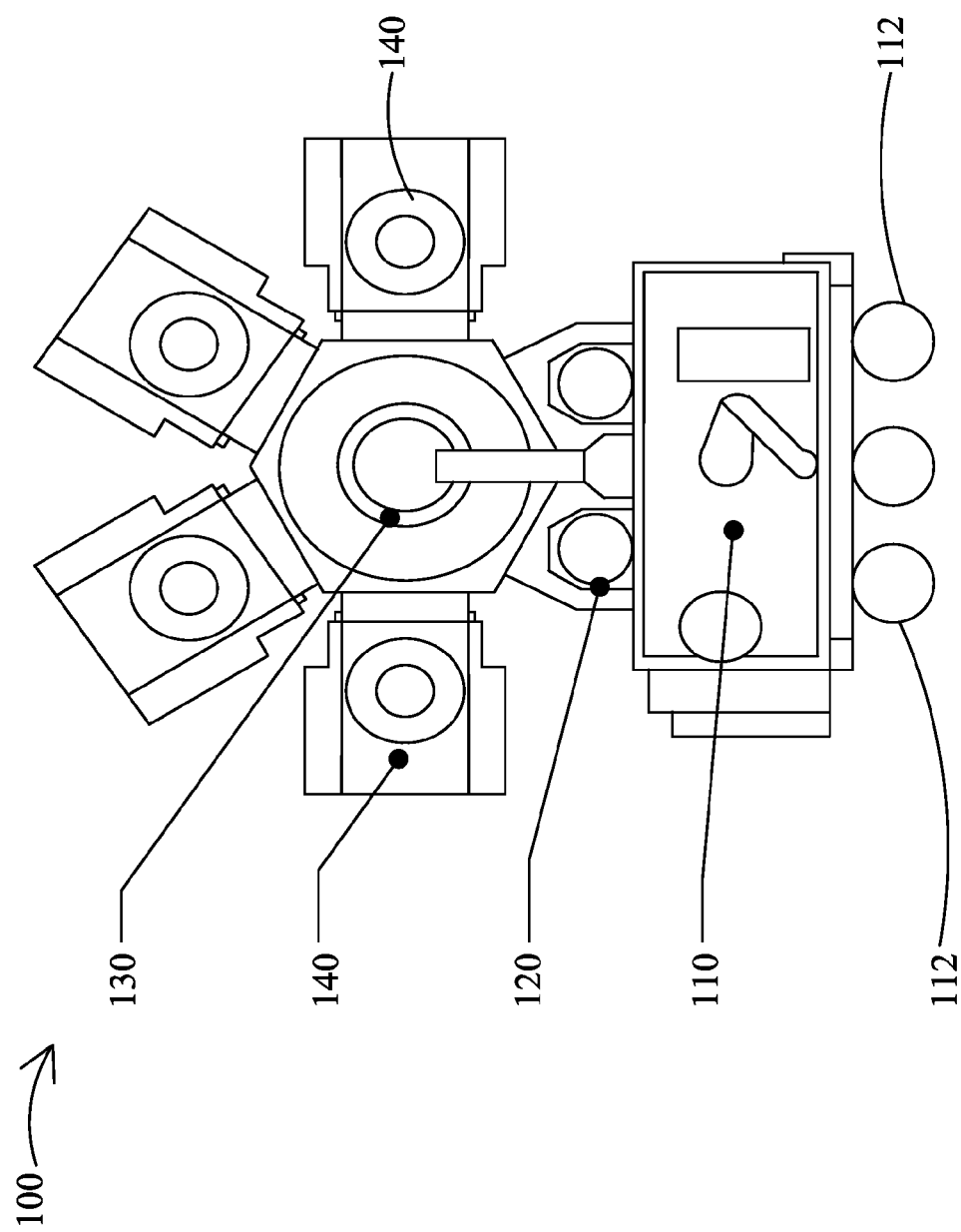
FIG. 1 shows a top plan view of a conventional vacuum wafer processing tool used in the current art in fabricating a semiconductor device.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
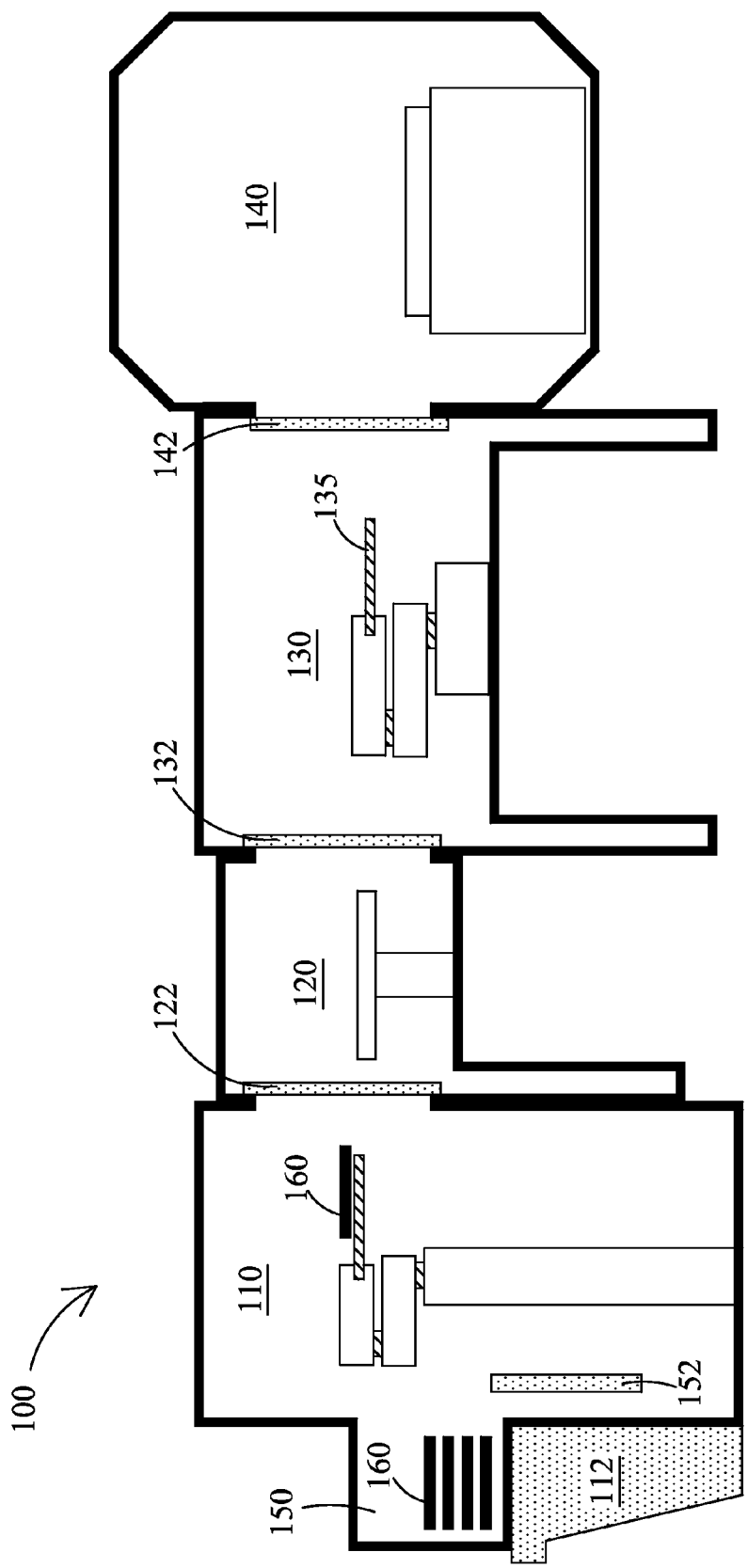
FIG. 2 shows a schematic cross-sectional side view of a conventional vacuum wafer processing tool used in the current art in fabricating a semiconductor device.

FIG. 1 shows a top plan view of a conventional vacuum wafer processing tool structure 100 used in the current art and FIG. 2 shows a schematic cross-sectional side view of the same. Referring to FIGS. 1 and 2, the conventional tool structure 100 generally includes an ATM (atmospheric pressure) transfer module 110, an airlock 120, a vacuum transfer module 130, and a plurality of vacuum process module or process chambers 140. The ATM transfer module 110 has several load ports 112 on a side thereof for docking FOUPs 150 therewith. Typically, the ATM transfer module 110 is operated at an atmospheric pressure inside and its primary function is just to receive the FOUPs 150 at its load ports 112, open the front opening door 152 of FOUPs 150, and take out wafers 160 into the transfer module 110 by using robot arms 115 installed within it before moving the wafers 160 to a next module for performing a process on them. As noted before, the conventional FOUPs 150 used in the current art has an atmospheric pressure inside, making them vulnerable to potential contaminations.

The airlock 120 is connected to the ATM transfer module 110, and is separated by an airlock door 122. In the fabrication of a semiconductor device, many wafer processes in the process chamber 140 are performed under vacuum or near-vacuum pressure. The airlock 120 operates as a buffer area where pressure on the wafers 160 is adjusted. After the wafers 160 are transferred into the airlock 120 from the transfer module 110, the airlock 120 changes the atmospheric pressure, to which the wafers 160 were subjected until then, to a specific value of pressure maintained in the vacuum transfer module 130, typically much lower than the atmospheric pressure or almost near vacuum as designated by a particular wafer process. The pressure in the airlock 120 is adjusted via a gas pump (not shown) attached thereto, and typically, an inflow of nitrogen ($N_2$) gas is used to control the pressure. The airlock door 122 and the vacuum module door 132, which separate the airlock 120 from the ATM transfer module 110 and the vacuum transfer module 130, respectively, prevent any gas flow when closed, to seal the airlock 120 and preserve the pressure therein. Opening the airlock door 122 or the vacuum module door 132 establishes a pressure and temperature equilibrium between the airlock 120 and whichever chamber that is open to the airlock 120, either the ATM transfer module 110 or the vacuum transfer module 130, through free gaseous communication between them. Once the pressure in the airlock 120 is adjusted to become equated with that of the vacuum transfer module 130 with the vacuum module door 132, the vacuum module door 132 is opened and the wafers are transferred into the vacuum transfer module 130.

The vacuum transfer module 130 plays the role of a central dock station where wafers 160 transferred from the airlock 120 are temporarily kept in preparation for processing and distributed to the plurality of process chambers 140 by robot arms 135. Typically, at each entrance to a process chamber 140, there is a chamber door 142. Once wafers 160 are transferred into a particular process chamber 140, the chamber door 142 is closed.

Once the wafers 160 are placed into a process chamber 140, the pressure therein, value of the vacuum transfer module 130, may be further changed individually to a different value as required by a particular process via a separate pressure pump connected to each process chamber 140. After the process is over, the pressure may be adjusted back to the initial vacuum transfer module value before the chamber door 142 is opened and the wafers 160 are transferred back into the vacuum transfer module 130. Generally, a single wafer processing tool 100 has one through twenty process chambers 140, and depending on a particular type of the processing tool, each process chamber 140 may perform the same, or different processing steps to the wafers 160 contained therein.

As seen in FIGS. 1 and 2, the FOUPs used in the current wafer transfer system transports the wafers under atmospheric pressure due to the incapability of a sealing system to keep the wafers under a pressurized environment. Such wafer handling exposes the wafers to the risk of all sorts of biochemical micro contamination arising from crept in moisture, micro-organisms, or chemicals, impairing the performance and quality of various wafer processing steps. Further, if the function of the ATM transfer module in the current wafer transport system, that is, merely to receive the FOUPs, take out wafers, and transfer them to the airlock for adjusting pressure, can be substituted by, for example, the airlock, the total time taken for processing wafers in a single processing tool would be shortened and the cost and efficiency of the whole fabrication process would be greatly improved. In light of the deficiency noted for the FOUPS and wafer transport system currently employed in the art, the present disclosure provides a non-atmospheric pressure controlled wafer carrier such as a FOUP for preventing potential contamination to the wafers, and an improved system and method for transporting wafers that utilize the pressure controlled wafer carrier.

Figure 3:
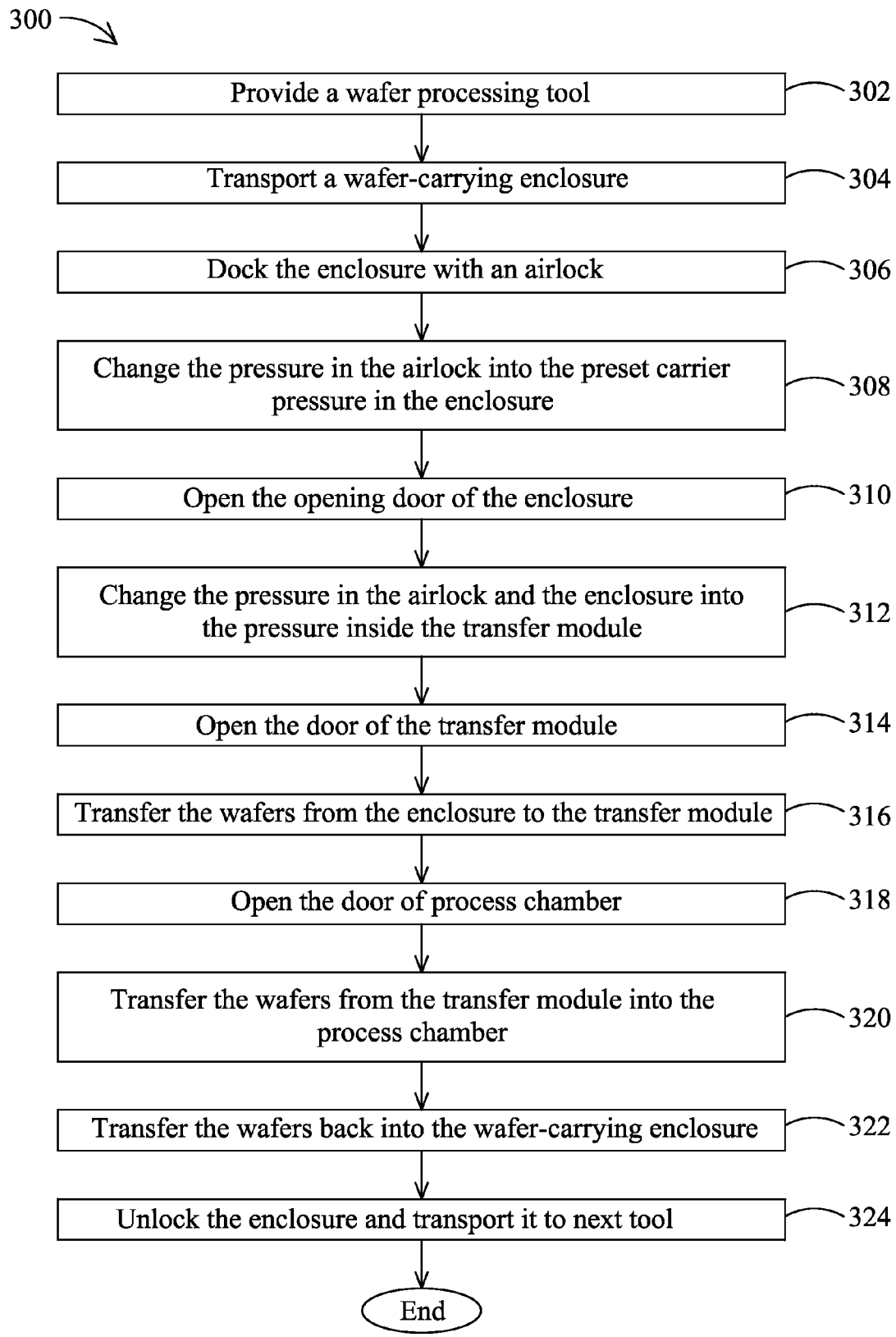
FIG. 3 is a schematic diagram of a method performed to transport pressure-controlled wafers in fabricating a semiconductor device according to an aspect of the present disclosure.

FIG. 3 is a schematic diagram of a method 300 performed to transport pressure-controlled wafers in fabricating a semiconductor device in an aspect of the present disclosure. The steps of the method 300 in FIG. 3 will be described herein while referring to FIGS. 4A-4D, which schematically show selected steps of the method 300.

Now referring to FIG. 3, at step 302, a wafer processing tool is provided. Herein, the word 'provide' is used in a broad sense to encompass all modes of procurement, including, but not limited to, 'purchasing', 'preparing', 'manufacturing', 'arranging,' or 'making in order' the object of provision, which is a wafer processing tool. Referring to FIG. 4A, the wafer processing tool 400 comprises an airlock 410, a transfer module 420, and a plurality of vacuum process module or process chambers 430. On one side, the airlock 410 has one or more load ports 412 for docking therewith one or more wafer-carrying enclosures 450 that have been designed in accordance with the present disclosure and transported. The structure of the wafer-carrying enclosures 450 will be described herein below when the nest step 304 is described. On another side, the airlock 410 is connected to the transfer module 420, while separated by a transfer module door 422. When the transfer module door 422 is closed, the airlock 410 is isolated from the transfer module 420 to have a different pressure. But when the transfer module door 422 is open, and the airlock 410 becomes in gaseous communication with the transfer module 420 to reach a pressure equilibrium therebetween. The primary function of the airlock 410 is to receive the wafer-carrying enclosures 450 at its load ports 412, adjusting the pressure therein suitably as will be described in the subsequent steps, opening the front opening door 452 of wafer-carrying enclosures 450, and taking out wafers 460 contained in the wafer-carrying enclosures 450 via robot arms into the transfer module 420. The pressure in the airlock 410 is adjusted via a gas pump 415 connected thereto, and typically, an inflow/outflow of nitrogen ($N_2$) gas, air, or mixture thereof is used to control the pressure.

The transfer module 420 plays the role of a central dock station where wafers 460 having been transferred from the airlock 410 are temporarily kept and orderly distributed to the plurality of process chambers 430 for a particular wafer processing. Upon the completion of the processing, the wafers 460 are gathered again in the transfer module 420 before being transferred back into individual wafer-carrying enclosures 450, again passing through the airlock 410. The transfer module 420 is selectively segregated from each of the process chambers 430 by a chamber door 432. When a chamber door 432 is closed, the corresponding process chamber 430 becomes isolated from the transfer module 420 and can have a different pressure via a separate gas pump if needed. For most of the wafer processing tools 400, the pressure in the transfer module 420 therein is maintained to be vacuum, near-vacuum, or extremely low pressure. In one embodiment, the transfer module 420 has a typical near-vacuum pressure, which is about 100 milli torr. In another embodiment, the transfer module 420 may have a higher or even atmospheric pressure, depending on the kind of wafer processing of a particular processing tool. The transfer module 420 has, typically, robot arms 425 installed therein to transfer the wafers 460 in and out of the airlock 410, the transfer module 420, and the process chambers 430.

The process chambers 430 are the actual room, in which the wafers 460 undergo various wafer processing steps for fabricating a particular semiconductor device. The wafers 460 are transferred from the transfer module 420 into a process chamber 430 under a pressure equilibrium, that is, having the same pressure with the transfer module 420. Once the wafers 460 are moved into the process chamber 430, the pressure therein may be further changed as required by a particular process. For that, there may be separate pressure pumps for each process chamber 430 or one single central pressure pump connected to all process chambers 430. Typically, a single wafer processing tool 400 may have multiple process chambers 430, typically between 1 and 20. Depending on a particular type of the processing tool, the multiple process chambers 430 in a single tool 400 may perform all identical processing steps to the wafers 460 in one embodiment, or in other embodiments, they may perform all or partly different processing steps.

Now referring back to FIG. 3, at step 304, a wafer-carrying enclosure containing a plurality of wafers therein is transported. FIG. 4A also shows such a wafer-carrying enclosure 450 being transported and approaching one of the load ports 412 of the airlock 410. Similar as a conventional FOUP (front opening unified pod), the wafer-carrying enclosure 450 may be designed to hold standard silicon wafers of standard size, 300 mm diameter in one embodiment. When fully loaded, it may hold 25 wafers. But the wafer-carrying enclosure 450 may be designed to hold any other number of wafers of any other size, pursuant the development of wafer size and particular processing needs. The wafer-carrying enclosure 450 may also have a front opening door 452 as a conventional FOUP, in one embodiment, to allow robot handling mechanisms 425 to access the wafers directly therethrough. It may further have various coupling plates, pins and holes (not shown) to allow the wafer-carrying enclosure 450 to be located on the load port 412 of the airlock 410 in the wafer processing tool 400 provided at step 302. The conventional inner structure of FOUPs, which the wafer-carrying enclosure 450 may assume as well, is well known in the art, and thus, not described herein further.

Further, the wafer-carrying enclosure 450 in the present disclosure is adapted to have a preset target carrier pressure inside that is maintained to be constant during transportation. The preset carrier pressure may be either higher or lower than the atmospheric pressure, depending on particular processing needs. The preset target pressure may be determined in consideration of various factors, such as the suitable level of pressure that would sufficiently ward off any dust, growth of bacteria or fungi, humidity, or chemicals that may potentially contaminate the wafers, and the level of pressure in the transfer module 420, which would depending on the type of specific processing steps performed in the processing chambers 430 in the tool 400. For maintaining a constant pressure inside, the wafer-carrying enclosure 450 may need to be equipped with an appropriately designed sealing structure. The sealing structure may utilize any suitable airtight sealing/packaging technique or material known in the art used for fabricating pressurized vessels. For example, if the target pressure is lower than the atmospheric pressure, the sealing structure may utilize techniques and materials used for vacuum sealing/packaging, hermetic sealing such as glass-metal seal, or barrier packaging with use of PTFE sealing rings, o-rings (optionally encapsulated o-rings), or PTFE sleeves. If the target pressure is higher than the atmospheric pressure, the techniques and materials used for pressurized sealing/packaging may be adopted for the sealing structure of the wafer-carrying enclosure 450. The shape of the wafer-carrying enclosure 450 may not need to be confined to the rectangular box-shape of a conventional FOUP. It may take almost any shape as desired by particular design and application needs, which may include shapes that have sections of spheres, cylinders, and cones.

The wafer-carrying enclosure 450 may be charged with the preset target inner pressure at an airlock equipped with a gas pump and a docking port, which may exist either as a standalone pressure-charging station or as a part of a wafer processing tool. Once charged, the wafer-carrying enclosure 450 is manipulated and transported on a conveyor, for example, from one tool to another for wafer processing among a plurality of wafer processing tools via a transport system, such as a conventional AMHS (Automated Material Handling System). The system of AMHS is well known in the art and thus, not described herein further.

The wafer-carrying enclosure 450 may further have a sensor/transmitter 455, such as a RFID tag, that wirelessly transmits signals of various information on a particular wafer-carrying enclosure 450, including, but not limited to, the preset target carrier pressure, actual pressure and temperature inside the enclosure 450, and the number of wafers contained. The wireless transmission can be effected via any wireless data communication technology known in the art, including a Wi-Fi, or Bluetooth networks. The signals can be picked up by a receiver installed at each wafer processing tool 400 or a standalone pressure-charging station.

Figure 4B:
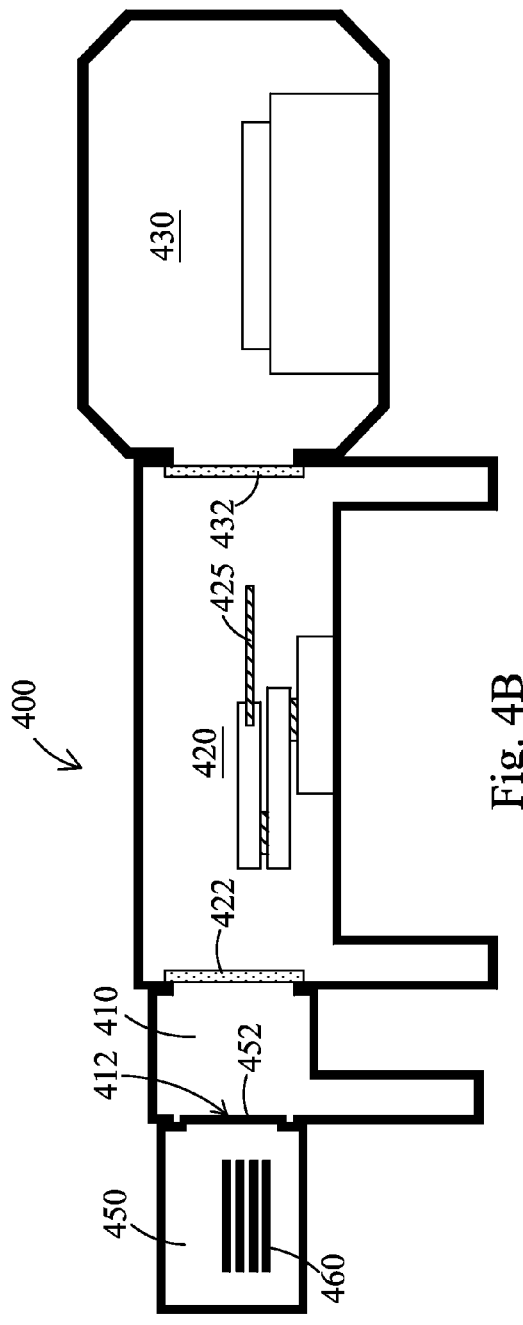

Referring again to FIG. 3, now at step 306, the wafer-carrying enclosure 450 is docked with the airlock 410 of the wafer processing tool 100 at one of its load ports 412. FIG. 4B schematically shows the wafer-carrying enclosure 450 being docked with the airlock 410 of the wafer processing tool 100. The docking may be achieved securely by using various coupling plates, pins and holes (not shown) formed on the enclosure 450. Once docked, the enclosure opening door 452 of the wafer-carrying enclosure 450 remains closed until the next step, as shown in FIG. 4B, to keep wafers 460 in the enclosure 450 under the constant carrier pressure. Either prior to, or at the time of, docking, the airlock 410 becomes informed of the various information on the particular wafer-carrying enclosure 450 that is approaching or currently docking. The information is transmitted from the sensor/transmitter 455 installed on the enclosure 450, and may be picked up either by a local receiver (not shown) present at each wafer processing tool 400, or by a receiver at a central server or control unit. In the latter case, the information is relayed to the particular processing tool 400 that the particular wafer-carrying enclosure 450 is docking with. As described above, the information on the wafer-carrying enclosure 450 may include preset target value of carrier pressure, actual pressure and temperature inside the enclosure 450, and the number of wafers contained therein, and be used in processing the wafers in the particular processing tool 400.

Figure 4C:
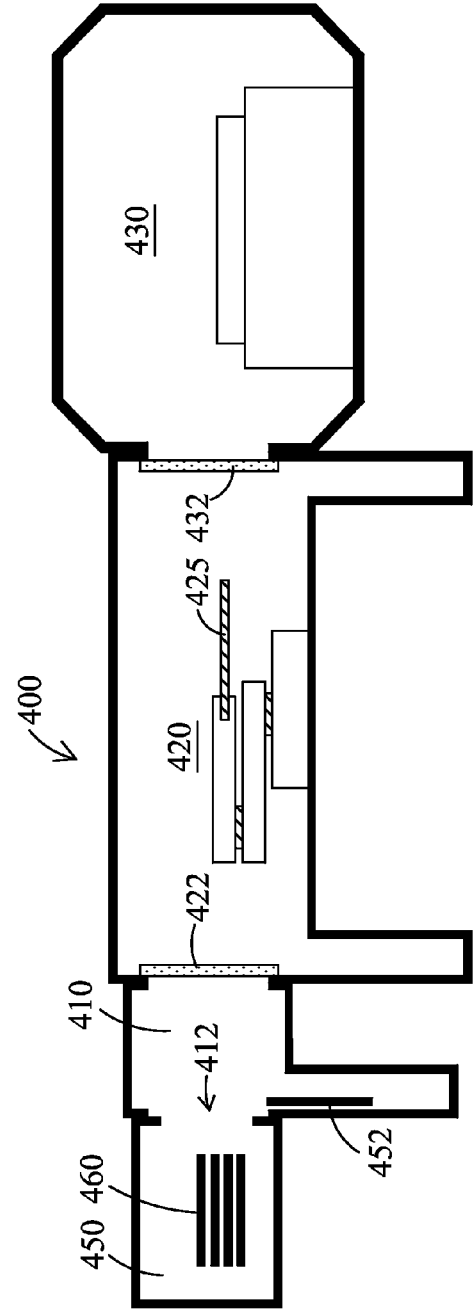

Referring again to FIG. 3 and also to FIG. 4C, at step 308, the pressure inside the airlock 410 is changed into the preset carrier pressure inside the wafer-carrying enclosure 450. Before the wafer-carrying enclosure 450 is docked with the airlock 410, the pressure inside the airlock 410 is different from the preset carrier pressure. In an embodiment, the pressure inside the airlock 410 is an atmospheric pressure. After the wafer-carrying enclosure 450 is docked, the airlock pressure is made equated with the preset carrier pressure by use of a gas pump 415. If the preset carrier pressure is lower than the atmospheric pressure, the air inside the airlock 410 is drawn out until the airlock pressure, the atmospheric pressure, reaches the preset carrier pressure. The changing pressure inside the airlock 410 can be measured by a pressure sensor (not shown) installed therein, which is connected to the pump 415 so that the gas pump 415 may precisely monitor and control the airlock pressure. If the preset carrier pressure is higher than the atmospheric pressure, the gas pump 415 pumps in either air or nitrogen ($N_2$) gas to increase the airlock pressure to the preset carrier pressure. In one embodiment, the gas pump 415 uses a gas consisting of 90% nitrogen and 10% air for pressure control, which may be varied in other embodiments. Until the pressure inside the airlock 410 is equated with the preset carrier pressure, the enclosure opening door 452 remains closed.

Once the pressure equilibrium between the wafer-carrying enclosure 450 and the airlock 410 is reached, then at step 310, the enclosure opening door 452 is opened. The wafers 460 within the enclosure 450 still come to remain under the same pressure environment. FIG. 4C schematically illustrates the enclosure 450 and the processing tool 400 after the enclosure-airlock pressure equilibrium is achieved and the enclosure door 452 is opened. The opening or closing of the enclosure opening door 452 may be performed by an enclosure door open/close mechanism 417 installed at the airlock 410 adjacent its load port 412, which is schematically shown in FIG. 4A. For tight sealing and preventing any gas flow when the enclosure opening door 452 is closed, in one embodiment, a plurality of conventional sealing O-rings 414, shown also schematically in FIG. 4A, may be used both at the enclosure opening door 452 and at the load port 412.

Referring again to FIG. 3, now at step 312, the pressure inside the airlock 410 and the wafer-carrying enclosure 450, now equal to the preset carrier pressure, is changed into the pressure inside the transfer module 420 with the transfer module door 422 closed. Again, the gas pump 415 connected to the airlock 410 is used to do that. In one embodiment, the pressure inside the transfer module 420 is maintained to be vacuum, near-vacuum, or extremely low pressure, such as the typical vacuum pressure of about 100 milli torr. In another embodiment, the transfer module 420 may have a higher or even atmospheric pressure, depending on the kind of specific wafer processing steps to be performed in the processing rooms 430. For example, for some photolithographic processing steps or cleaning process, an atmospheric pressure may be used in the transfer module 420 (in this case, the term 'vacuum' in the name of the 'vacuum transfer module' would be a misnomer).

Figure 4D:
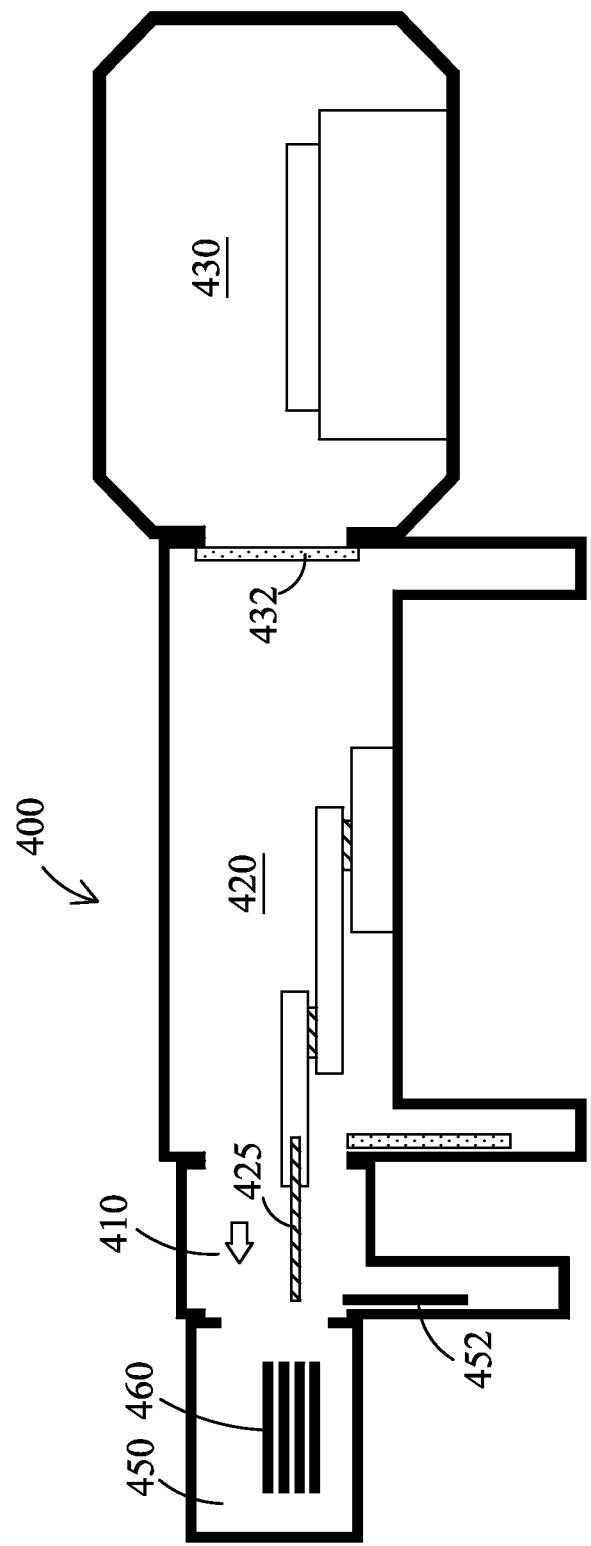

Once the pressure inside the airlock 410 and the wafer-carrying enclosure 450 is equated with that in the transfer module 420, then at step 314, the transfer module door 422 is opened. At this stage, all of the airlock 410, the transfer module 420, and the wafer-carrying enclosure 450 come to be lying under the same pressure, the pressure of the transfer module 420. FIG. 4D schematically illustrates this stage of step 312 after the transfer module door 422 is opened. The opening or closing of the transfer module door 422 may be performed by a door open/close mechanism 427 installed adjacent the transfer module door 422 as shown in FIG. 4A, a similar kind to the enclosure door open/close mechanism 417.

After the transfer module door 422 is opened, then at step 316, the wafers 460 inside the wafer-carrying enclosure 450 is transferred into the transfer module 420 by a plurality of robot arms 425 installed in the transfer module 420. The robot arm 425, schematically shown in FIG. 4A, has a forked shape to draw the wafers, and is a conventional one commonly used in the art. More detailed structure, thus, is not described herein further.

Referring again to FIG. 3, now at step 318, the chamber door 432 of a particular process chamber 430 is opened by a door open/close mechanism (not shown), similar to the door open/close mechanisms 417 or 427. Out of many process chambers 430, which particular chamber is to be opened to transfer the wafers 460, now waiting in the transfer module 420, may be determined by a predetermined process order and automatically controlled by a control center or server computer connected to the transfer module 420. Preferably, before the door 432 of a particular process chamber 430 is opened, the inside pressure of the process chamber 430 may be adjusted to equate with that of the transfer module 420 via a separate gas pump (not shown) connected to the process chamber 430 so as to maintain the pressure of the transfer module 420 undisturbed after the chamber door 432 is opened.

Still referring to FIG. 3, now at step 320, the wafers 460 inside the transfer module 420 are transferred into the chosen particular process chamber 430 for processing, again by a plurality of robot arms 425 installed in the transfer module 420. After the wafers 460 are transferred, the chamber door 432 is closed, and depending on the need of a particular process step, the pressure inside the process chamber 430 may be further changed to a higher or lower value than the vacuum transfer module pressure. In that situation, the chamber pressure needs to be adjusted back to the vacuum transfer module pressure after processing of the wafers 460 is over and before opening the chamber door 432 to transfer back the wafers 460 into the transfer module 420.

Continuing to refer to FIG. 3, after processing of the wafers 460 is over, then at step 322, the wafers 460 are transferred back from the process chamber 430 into the wafer-carrying enclosure 450, going through successive transfers into the transfer module 420 and the airlock 410. Then at step 324, the wafer-carrying enclosure 450 is charged back with the preset carrier pressure. Such a pressure back-charging step is performed basically following the forward steps of the method 300 in the reverse order. More specifically, the pressure back-charging process after transferring the wafers 460 back into the wafer-carrying enclosure 450 includes: closing the transfer module door 422; changing the pressure inside the airlock 410 and the wafer-carrying enclosure 450 into the preset carrier pressure; and closing the enclosure opening door 412. The details of those reverse steps are identical with the forward steps and thus, not described herein further.

Lastly, at step 324, the wafer-carrying enclosure 450 is undocked from the airlock 410 and transported to the next wafer processing tool via the AMHS for the another wafer processing.

Figure 5:
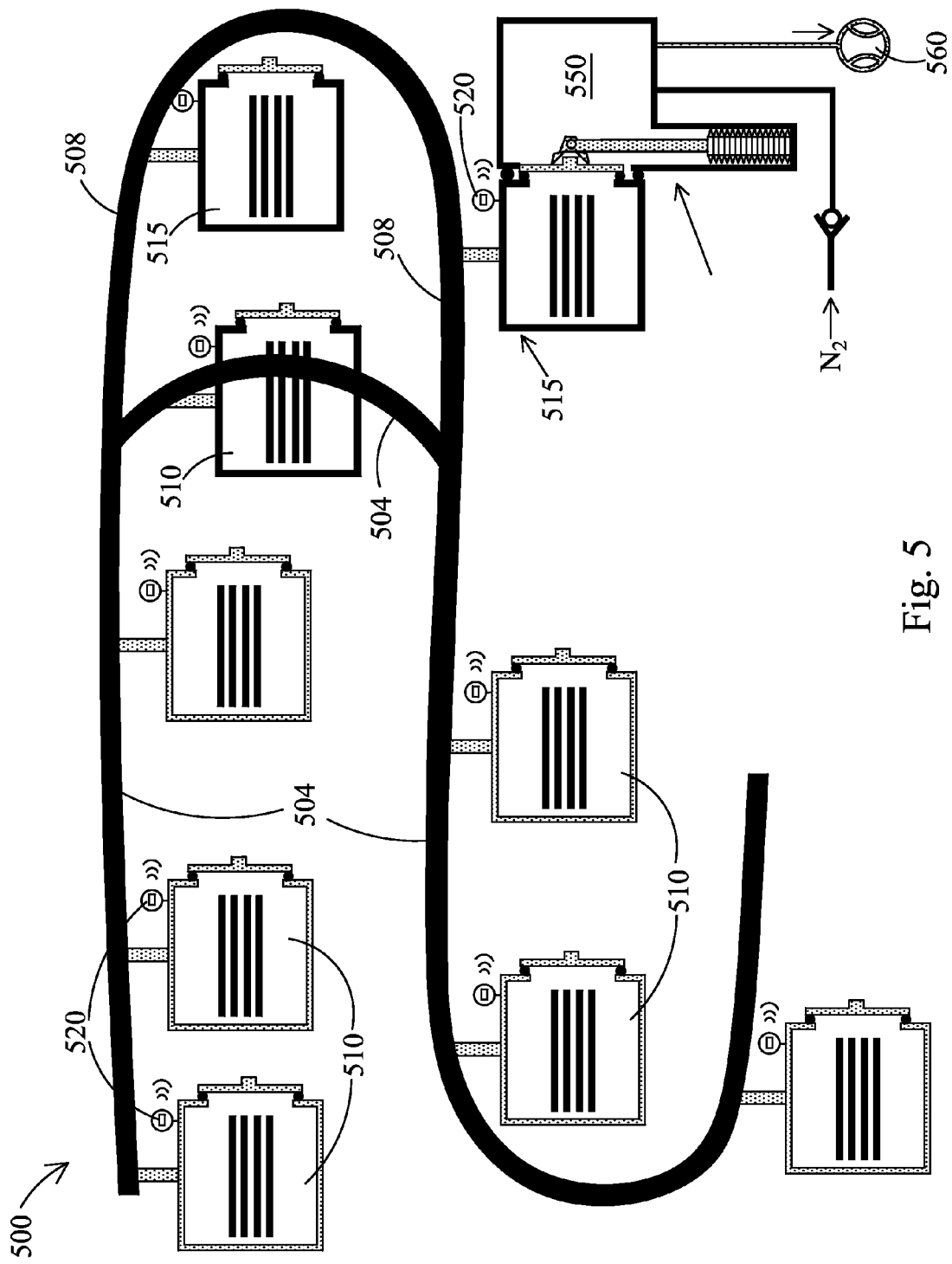
FIG. 5 schematically shows a step of the method illustrated in FIG. 3 according an aspect of the present disclosure.

The method 300 for transporting wafers between a plurality of wafer processing tools may further comprise a step for charging the wafer-carrying enclosure with the preset carrier pressure, during its transportation among the wafer processing tools, if the actual pressure measured and broadcasted by the sensor/transmitter is different from the preset carrier value. FIG. 5 schematically illustrates such a step, in which a plurality of wafer-carrying enclosures 510 are being transported, travelling among different wafer processing tools (not shown) via a transport system 500 such as a AMHS. During the transportation, the sensor/transmitters 520 attached to the individual enclosures keep wirelessly broadcasting various information on the respective enclosures, specifically the actual inside pressure. Such transmitted information is received by, for example, a standalone pressure-charging station or airlock 550 that is connected to a gas pump 560. If the broadcasted actual pressure of some wafer-carrying enclosures 515 is different from the preset carrier value, those enclosures 515 are taken from its regular track 504 into a sidetrack 508 and brought into the airlock 550, where they are charged with the correct pressure of a preset carrier value.

By the novel pressure-controlled wafer carrier described in the present disclosure, the inner pressure of each wafer carrier can be maintained at a constant pressure, either below or above the atmospheric pressure as necessitated by a specific design and processing need, so that the problem of wafer contaminations for conventional wafer carriers in the art, such as FOUPs, that keep wafers under uncontrolled, atmospheric pressure can be solved. Further, the wafer transport method described in the present disclosure, used together with the pressure-controlled wafer carrier in the present disclosure, enables considerable saving of total process time and cost by eliminating the need to use the ATM transfer module, a component in the conventional wafer transport system.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of transporting wafers at a first wafer processing tool including an airlock having a first pressure inside, a transfer module in gaseous communication with the airlock, but isolatable therefrom by a first door located therebetween, and a process chamber in gaseous communication with the transfer module, but isolatable therefrom by a second door located therebetween, the transfer module and the process chamber having a second and a third preset pressures inside, respectively; the method comprising:
   adjusting pressure within a wafer-carrying enclosure containing a plurality of wafers therein to a preset carrier pressure that is different than an atmospheric pressure;
   after adjusting the pressure, transporting the wafer-carrying enclosure containing the plurality of wafers therein at the preset carrier pressure to the airlock, the wafer-carrying enclosure having an enclosure opening and an enclosure door for transferring the plurality of wafers therethrough, wherein the wafer-carrying enclosure has the preset carrier pressure inside the wafer-carrying enclosure during transportation;
   docking the wafer-carrying enclosure with the airlock;
   changing the first pressure inside the airlock into the preset carrier pressure;
   opening the enclosure door;
   changing the carrier pressure inside the airlock and the wafer-carrying enclosure into the second pressure;
   opening the first door;
   transferring the plurality of the wafers from the wafer-carrying enclosure into the transfer module;
   opening the second door; and
   transferring the plurality of the wafers from the transfer module into the process chamber for processing.

2. The method of claim 1, further comprising: transferring the plurality of the wafers, after processing, from the process chamber back into the wafer-carrying enclosure.

3. The method of claim 2, further comprising: charging the wafer-carrying enclosure with the carrier pressure after the transferring the plurality of the wafers back into the wafer-carrying enclosure.

4. The method of claim 3, further comprising: undocking the wafer-carrying enclosure from the airlock after the charging the wafer-carrying enclosure with the carrier pressure; and transporting the wafer-carrying enclosure to a second wafer processing tool.

5. The method of claim 1, further comprising wirelessly broadcasting, by a sensor-transmitter disposed at the wafer-carrying enclosure, actual pressure as well as the number of the plurality of wafers and/or temperature inside the wafer-carrying enclosure during the transportation thereof.

6. The method of claim 5, further comprising charging the wafer-carrying enclosure with the carrier pressure if the actual pressure broadcasted by the sensor is different from the carrier pressure.

7. The method of claim 6, wherein the charging the wafer-carrying enclosure with the carrier pressure includes:
   taking the wafer-carrying enclosure from a regular transport track into a side track;
   bringing the wafer-carrying enclosure into a side track airlock; and
   charging the wafer-carrying enclosure with the carrier pressure.

8. The method of claim 1, wherein the preset carrier pressure is below the atmospheric pressure.

9. The method of claim 1, wherein the preset carrier pressure is above the atmospheric pressure.

10. A method of transporting wafers, comprising:
    adjusting pressure within a wafer-carrying enclosure containing a plurality of wafers therein to a first pressure that is different than an atmospheric pressure;
    after adjusting the pressure, transporting the wafer-carrying enclosure containing the plurality of wafers therein to an airlock, the wafer-carrying enclosure having an enclosure opening and an enclosure door for transferring the plurality of wafers therethrough, wherein the wafer-carrying enclosure has the preset carrier pressure inside the wafer-carrying enclosure during transportation;
    wirelessly broadcasting, by a sensor-transmitter disposed at the wafer-carrying enclosure, an actual pressure inside the wafer-carrying enclosure during the transporting thereof;
    docking the wafer-carrying enclosure with the airlock of a first wafer processing tool;
    changing a tool pressure inside the airlock to equal the first pressure;
    opening the enclosure door;
    changing the carrier pressure inside the airlock and the wafer-carrying enclosure to a second pressure;
    opening a first door of the first processing tool; and
    transferring the plurality of the wafers through the first door and into a process chamber for processing.

11. The method of claim 10, further comprising:
    transferring the plurality of the wafers from the wafer-carrying enclosure into a transfer module; and
    opening a second door of the first processing tool.

12. The method of claim 10, further comprising:
    transferring the plurality of the wafers, after processing, from the process chamber back into the wafer-carrying enclosure.

13. The method of claim 10, further comprising:
    charging the wafer-carrying enclosure with a predetermined pressure after the transferring the plurality of the wafers back into the wafer-carrying enclosure.

14. The method of claim 13, further comprising:
    undocking the wafer-carrying enclosure from the airlock after the charging the wafer-carrying enclosure; and
    transporting the wafer-carrying enclosure to a second wafer processing tool.

15. The method of claim 13, further comprising charging the wafer-carrying enclosure with the carrier pressure if the actual pressure broadcasted by the sensor is different from the predetermined carrier pressure.

16. The method of claim 15, wherein the charging the wafer-carrying enclosure with the carrier pressure includes:
    taking the wafer-carrying enclosure from a regular transport track into a side track;
    bringing the wafer-carrying enclosure into a side track airlock; and
    charging the wafer-carrying enclosure with the carrier pressure.

17. The method of claim 10, wherein changing the tool pressure and the changing the carrier pressure are achieved by a gas pump attached to the airlock.

18. The method of claim 17, wherein the gas pump utilizes nitrogen ($N_2$) gas for changing pressures.

19. The method of claim 10, further comprising:
wirelessly broadcasting, by the sensor-transmitter disposed at the wafer-carrying enclosure, a number of the plurality of wafers and a temperature inside the wafer-carrying enclosure during the transportation thereof.

20. A method of transporting wafers at a first wafer processing tool including an airlock having a first pressure inside, a transfer module in gaseous communication with the airlock, but isolatable therefrom by a first door located therebetween, and a process chamber in gaseous communication with the transfer module, but isolatable therefrom by a second door located therebetween, the transfer module and the process chamber having a second and a third preset pressures inside, respectively; the method comprising:
adjusting pressure within a wafer-carrying enclosure containing a plurality of wafers therein to a carrier pressure that is different than an atmospheric pressure;
after adjusting the pressure, transporting the wafer-carrying enclosure containing the plurality of wafers there to the airlock, the wafer-carrying enclosure having an enclosure opening and an enclosure door for transferring the plurality of wafers therethrough, wherein the wafer-carrying enclosure is adapted to provide and does provide the preset carrier pressure inside the wafer-carrying enclosure during transportation;
docking the wafer-carrying enclosure with the airlock;
changing the first pressure inside the airlock into the carrier pressure;
opening the enclosure door;
changing the carrier pressure inside the airlock and the wafer-carrying enclosure into the second pressure;
opening the first door;
transferring the plurality of the wafers from the wafer-carrying enclosure into the transfer module;
opening the second door;
transferring the plurality of the wafers from the transfer module into the process chamber for processing; and
charging the wafer-carrying enclosure with the carrier pressure after the transferring the plurality of the wafers back into the wafer-carrying enclosure.

\* \* \* \* \*